(12) United States Patent
Park et al.

(10) Patent No.: US 8,437,205 B2
(45) Date of Patent: May 7, 2013

(54) SEMICONDUCTOR MEMORY APPARATUS

(75) Inventors: Mun Phil Park, Ichon-shi (KR); Jung Hwan Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 12/970,693

(22) Filed: Dec. 16, 2010

(65) Prior Publication Data

US 2012/0106273 A1 May 3, 2012

(30) Foreign Application Priority Data

Oct. 29, 2010 (KR) .......................... 10-2010-0106907

(51) Int. Cl.
*G11C 7/00* (2006.01)

(52) U.S. Cl.
USPC .................. 365/193; 365/189.05; 365/230.06

(58) Field of Classification Search .................. 365/193, 365/230.06, 189.05
See application file for complete search history.

(56) References Cited

U.S. PATENT DOCUMENTS

| 6,188,639 | B1 | 2/2001 | Sakakibara |
| 6,252,804 | B1 * | 6/2001 | Tomita ..................... 365/189.05 |
| 7,380,092 | B2 * | 5/2008 | Perego et al. ................. 711/171 |
| 7,684,258 | B2 * | 3/2010 | Kanda et al. ............. 365/189.03 |
| 2007/0159913 | A1 | 7/2007 | Lee et al. |
| 2008/0298138 | A1 | 12/2008 | Arai |

FOREIGN PATENT DOCUMENTS

| JP | 2008-298677 | 12/2008 |
| KR | 100753418 B1 | 8/2007 |
| KR | 100780613 B1 | 11/2007 |
| KR | 10-0800382 B1 | 1/2008 |
| KR | 10-2009-0072270 A | 7/2009 |

\* cited by examiner

*Primary Examiner* — Son Dinh
(74) *Attorney, Agent, or Firm* — William Park & Associates Patent Ltd.

(57) ABSTRACT

Various embodiments of a semiconductor memory apparatus are disclosed. In one exemplary embodiment, the semiconductor memory apparatus may include: a column control signal generator configured to generate a column control signal for a pair of bit lines corresponding to a data mask during a data mask operation; and a bit line sense amplifier configured to sense and amplify a voltage difference between the pair of bit lines and electrically couple the pair of bit lines to a pair of segment input/output lines in response to the column control signal.

12 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean Patent Application No. 10-2010-0106907, filed on Oct. 29, 2010, in the Korean Intellectual Property Office, which is incorporated herein by reference in its entirety as if set forth in full.

BACKGROUND

1. Technical Field

The disclosure relates to a semiconductor memory apparatus, and more particularly, to a semiconductor memory apparatus using a data mask method.

2. Related Art

A typical data mask operation may be performed so as not to change information which has been written in a specific memory area even though new data is written in a semiconductor memory apparatus. In particular, when data having the same information are inputted and outputted, the data mask operation may prevent unnecessary input and output of the corresponding data.

In a typical semiconductor memory apparatus such as a DRAM, the data mask operation may be performed according to the following process. In a DRAM, a write operation is performed in a manner that a pair of segment input/output lines SIO/SIOB are precharged according to inputted data and a pair of bit lines BL/BLB amplified by a bit line sense amplifier are electrically coupled to the pair of segment input/output lines SIO/SIOB while a column control signal YI is activated. In the data mask operation, the pair of segment input/output lines SIO/SIOB are precharged to a predetermined level, for example, a core voltage VCORE without using the inputted data, and the pair of bit lines BL/BLB and the pair of segment input/output lines SIO/SIOB precharged to the core voltage VCORE are electrically coupled respectively while the column control signal YI is activated in case of a data write operation. Thus, the logic values of the pair of bit lines BL/BLB are not changed.

In such a data mask operation, when the pair of bit lines BL/BLB amplified by the bit line sense amplifier and the pair of segment input/output lines SIO/SIOB precharged to the core voltage VCORE are electrically coupled in response to the column control signal YI, charge sharing occurs between the pair of bit lines BL/BLB and the pair of segment input/output lines SIO/SIOB respectively. For example, since the pair of bit lines BL/BLB were amplified to the levels of an external voltage VDD and a ground voltage VSS, respectively, and the pair of segment input/output lines SIO/SIOB are precharged to the level of the core voltage VCORE, a temporary voltage rise/drop occurs in the pair of bit lines BL/BLB while the column control signal YI is activated. The bit line sense amplifier is designed in such a manner that an unexpected change in the logic values of the pair of bit lines BL/BLB does not occur even though such a temporary voltage rise/drop occurs.

The column control signal YI is a signal for controlling the operation of electrically coupling the pair of bit lines BL/BLB to the pair of segment input/output lines SIO/SIOB in a read/write operation, and may be generated by decoding a column address signal while a strobe signal is activated. Therefore, the strobe signal becomes a source signal of the column control signal YI. Furthermore, the column control signal YI is set to be activated with a longer pulse width during a write operation than during a read operation, in order to stably write data.

One problem with a conventional semiconductor memory apparatus is that undesired data may be written during the data mask operation. With a high-integration and low-power trend of a semiconductor memory apparatus, the drivability of a bit line sense amplifier has been gradually reduced. Accordingly, an unexpected logic value transition may occur in the pair of bit lines BL/BLB. More specifically, as described above, a temporary voltage rise/drop may occur in the pair of bit lines BL/BLB due to the charge sharing between the pair of bit lines BL/BLB and the pair of segment input/output lines SIO/SIOB precharged to the core voltage VCORE during the period in which the column control signal YI is activated in case of a data mask operation. In a normal data mask operation, the bit line sense amplifier should be able to tolerate such a temporary voltage rise/drop at this time. However, as the drivability of the bit line sense amplifier is reduced, the bit line sense amplifier may not tolerate such a temporary voltage rise/drop, but may change the logic values of the pair of bit lines BL/BLB.

SUMMARY

Accordingly, there is a need for an improved semiconductor memory apparatus that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

One exemplary embodiment of a semiconductor memory apparatus includes: a column control signal generator configured to generate a column control signal for a pair of bit lines corresponding to a data mask during a data mask operation; and a bit line sense amplifier configured to sense and amplify a voltage difference between the pair of bit lines and couple the pair of bit lines to a pair of segment input/output lines in response to the column control signal.

In another exemplary embodiment, a semiconductor memory apparatus includes: a blocking signal generator configured to activate a blocking signal when a data mask signal is activated; and a column control signal generator configured to generate a column control signal by decoding a column address signal, while a strobe signal is activated, and deactivate and generate the column control signal when the blocking signal is activated.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
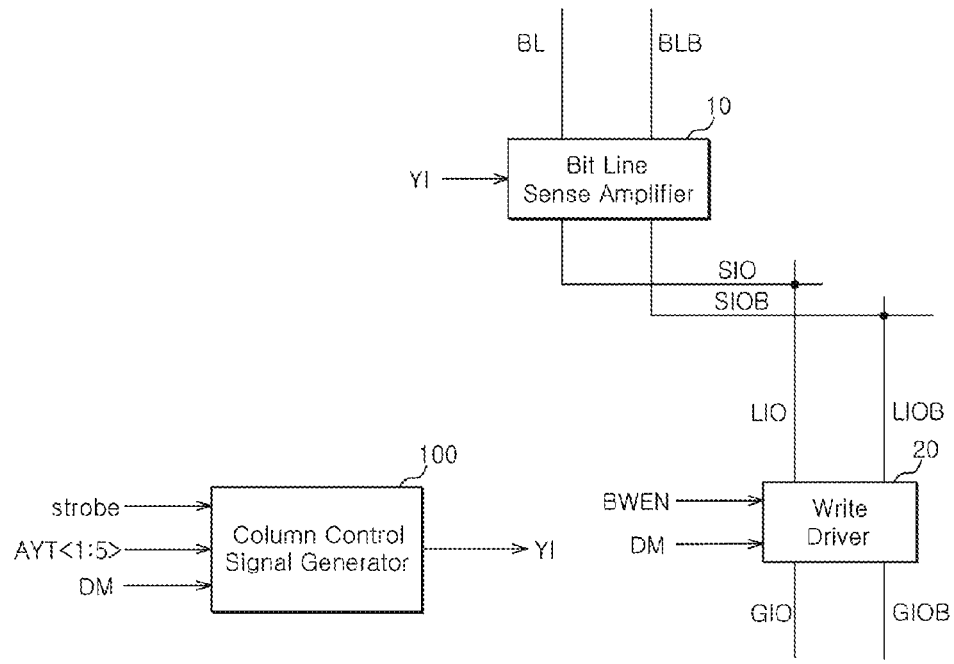
FIG. 1 is a schematic diagram depicting a semiconductor memory apparatus according to one exemplary embodiment.

Reference will now be made in detail to the exemplary embodiments consistent with the present disclosure, examples of which are illustrated in the accompanying drawings. Wherever possible, the same reference characters will be used throughout the drawings to refer to the same or like parts.

In a conventional semiconductor memory apparatus, a data mask operation precharges the pair of segment input/output lines SIO/SIOB to the core voltage VCORE, thereby blocking a data write operation. However, a semiconductor memory apparatus according to one embodiment may not activate a column control signal YI for a pair of bit lines BL/BLB in which a write operation is to be blocked in addition to the data mask operation, which may prevent an unexpected logic value transition of the pair of bit lines BL/BLB.

FIG. 1 is a schematic diagram illustrating a semiconductor memory apparatus according to one embodiment of the present invention.

The semiconductor memory apparatus illustrated in FIG. 1 may be configured to perform a data mask operation. Furthermore, the semiconductor memory apparatus may be configured so as not to activate the column control signal YI in response to a data mask signal DM for controlling the data mask operation.

The semiconductor memory apparatus illustrated in FIG. 1 may include a bit line sense amplifier 10, a write driver 20, and a column control signal generator 100.

The bit line sense amplifier 10 may be configured to sense and amplify a voltage difference between a pair of bit lines BL/BLB, and electrically couple the pair of bit lines BL/BLB to a pair of segment input/output lines SIO/SIOB respectively when the column control signal YI is activated. The bit line sense amplifier 10 may include a general bit line sense amplifier.

The write driver 20 may be configured to electrically couple a pair of global input/output lines GIO/GIOB and a pair of local input/output lines LIO/LIOB in response to a write enable signal BWEN. During a write operation of the semiconductor memory apparatus, data to be written may be first applied to the pair of global input/output lines GIO/GIOB. Then, when the write enable signal BWEN is activated, the data may be applied to the pair of local input/output lines LIO/LIOB. The write driver 20 may include a general write driver.

The write driver 20 may be configured to additionally receive the data mask signal DM and precharge the pair of local input/output lines LIO/LIOB to a predetermined level, for example, a core voltage VCORE according to the data mask signal DM. Such a configuration may be provided for the data mask operation according to the conventional semiconductor memory apparatus, and the write driver 20 may include a general write driver configured to support the data mask operation.

The pair of local input/output lines LIO/LIOB and the pair of segment input/output lines SIO/SIOB may be electrically coupled to each other. In a general semiconductor memory apparatus, the pair of local input/output lines LIO/LIOB may be electrically coupled to the pair of segment input/output lines SIO/SIOB through an input/output switch circuit. However, the input/output switch circuit and the operation thereof are not needed in describing the semiconductor memory apparatus according to the embodiment. Therefore, the input/output switch circuit is not illustrated in FIG. 1, and the detailed descriptions thereof are omitted herein.

The column control signal generator 100 may be configured to generate the column control signal YI in response to the data mask signal DM, a strobe signal STROBE, and a column address signal AYT<1:5>. The column control signal generator 100 decodes the column address signal AYT<1:5> while the strobe signal STROBE is activated, and generates the column control signal YI according to the decoding result. In this case, when the data mask signal DM is activated, the column control signal generator 100 may deactivate the column control signal YI. The data mask signal DM is a signal which may be activated when the semiconductor memory apparatus performs a data mask operation, and the strobe signal STROBE is a source signal of the column control signal YI and may be activated during a read or write operation. Furthermore, the column address signal AYT<1:5> is a signal which has column-related address information of the semiconductor memory apparatus, and the bit number thereof may differ depending on memory areas of the semiconductor memory apparatus. In FIG. 1, the column address signal AYT<1:5> is illustrated for example as a 5-bit signal.

In the semiconductor memory apparatus of FIG. 1, when the data mask signal DM is activated, the column control signal generator 100 may deactivate the column control signal YI. Therefore, the bit line sense amplifier 10 may not electrically couple the pair of bit lines BL/BLB to the pair of segment input/output lines SIO/SIOB. Therefore, a temporary voltage rise/drop may not occur in the pair of bit lines BL/BLB. Accordingly, the semiconductor memory apparatus according to the embodiment may solve the problem of the conventional memory apparatus in which the bit line sense amplifier does not cover a temporary voltage rise/drop in the pair of bit lines BL/BLB and thus an unexpected logic value transition occur in the pair of bit lines BL/BLB.

Figure 2:
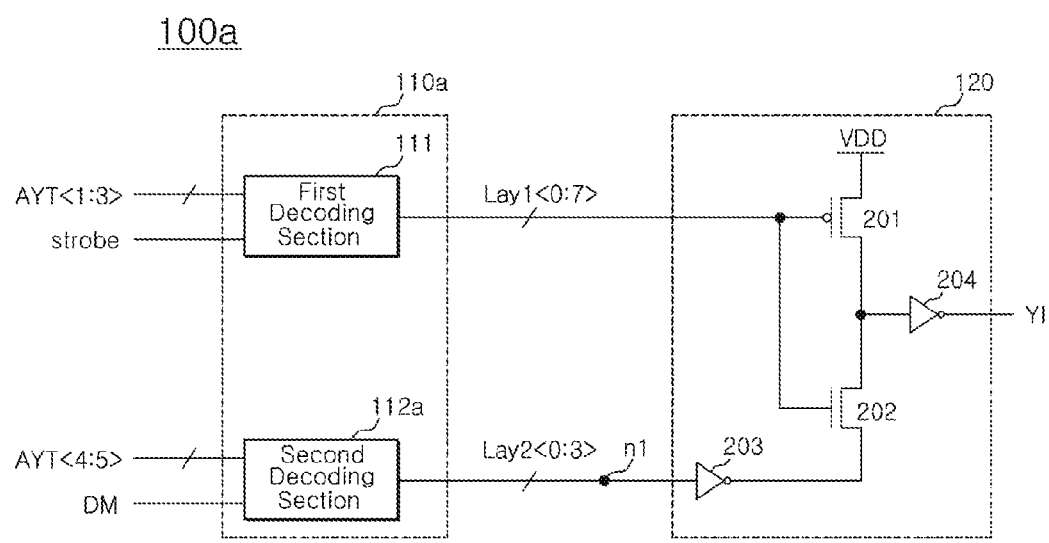
FIG. 2 is a circuit diagram illustrating an example of a column control signal generator illustrated in FIG. 1.

FIG. 2 is a circuit diagram illustrating an example of the column control signal generator 100 illustrated in FIG. 1.

The column control signal generator 100a may include a pre-decoding unit 110a and a main decoding unit 120.

The pre-decoding unit 110a may be configured to receive the column address signal AYT<1:5>, the strobe signal STROBE, and the data mask signal DM and generate decoding signals Lay1<0:7> and Lay2<0:3>.

The main decoding unit 120 may be configured to generate the column control signal YI in response to the decoding signals Lay1<0:7> and Lay2<0:3>. 32 the column control signals YI can be generated according to combination of the decoding signals Lay1<0:7> of 8 bits and the decoding signals Lay2<0:3> of 4 bits. one of the 32 the column signals YI were an example in FIG. 2.

The pre-decoding unit 110a may decode the column address signal AYT<1:5> and generate the decoding signals Lay1<0:7> and Lay2<0:3>, while the strobe signal STROBE is activated. In this case, when the data mask signal DM is activated, the pre-decoding unit 110a may generate the decoding signals Lay1<0:7> and Lay2<0:3> such that the main decoding unit 120 deactivates the column control signal YI. Referring to FIG. 2, the pre-decoding unit 110a may include a first decoding section 111 and a second decoding section 112a.

The first decoding section 111 may be configured to generate the first decoding signal Lay1<0:7> by decoding a first address signal AYT<1:3> of the column address signal AYT<0:5>, while the strobe signal STROBE is activated. The first decoding section 111 may include a general decoder which is enabled in response to the strobe signal STROBE.

The second decoding section 112*a* may be configured to generate the second decoding signal Lay2<0:3> by decoding the second address signal AYT<4:5> of the column address signal AYT<1:5> while the data mask signal DM is deactivated. When the data mask signal DM is activated, the second decoding section 112*a* may generate the second decoding signal Lay2<0:3> such that the main decoding unit 120 deactivates the column control signal YI. The generation of the second decoding signal Lay2<0:3> will be described below in more detail with reference to FIG. 5.

The column control signal generator 100*a* illustrated in FIG. 2 controls the column address signal YI, as the second decoding unit 112*a* differently generates the second decoding signal Lay2<0:3> depending on the data mask signal DM. The process in which the second decoding section 112*a* differently operates depending on the data mask signal DM has been described as an example. In an embodiment, the first decoding section 111 may be configured to generate the first decoding signal Lay<0:7> in response to the data mask signal DM. The process in which the second decoding signal Lay2<0:3> is differently generated in response to the data mask signal DM in the column control signal generator 100*a* illustrated in FIG. 2 does not limit a specific decoding section for embodying the present invention.

As illustrated in FIG. 2, the main decoding unit 120 may include a PMOS transistor 201, an NMOS transistor 202, and inverters 203 and 204.

The PMOS transistor 201 and the NMOS transistor 202 may be coupled in series between an external voltage VDD and an output terminal of the inverter 203, and configured to commonly receive the first decoding signal Lay1<0:7> through gate terminals thereof. The inverter 203 is configured to invert and output the second decoding signal Lay2<0:3>. The inverter 204 has an input terminal coupled to a coupling terminal between the PMOS transistor 201 and the NMOS transistor 202, and may be configured to invert the voltage level of the coupling terminal and output the column control signal YI. The main decoding unit 120 illustrated in FIG. 2 operates as follows. The PMOS transistor 201 and the NMOS transistor 202 serve as inverters depending on the voltage level of the output terminal of the inverter 203. Therefore, when the voltage of an input terminal of the inverter 203, that is, a first node N1 becomes a high level, the main decoding unit 120 may output the first decoding signal Lay1<0:7> as the column control signal YI. On the other hand, when the voltage of the first node n1 becomes a low level, the PMOS transistor 201 and the NMOS transistor 202 are deactivated, and the main decoding unit 120 does not activate the column control signal YI. That is, the operation in which the main decoding unit 120 generates the column control signal YI may be blocked depending on the voltage level of the first node n1.

Figure 3:
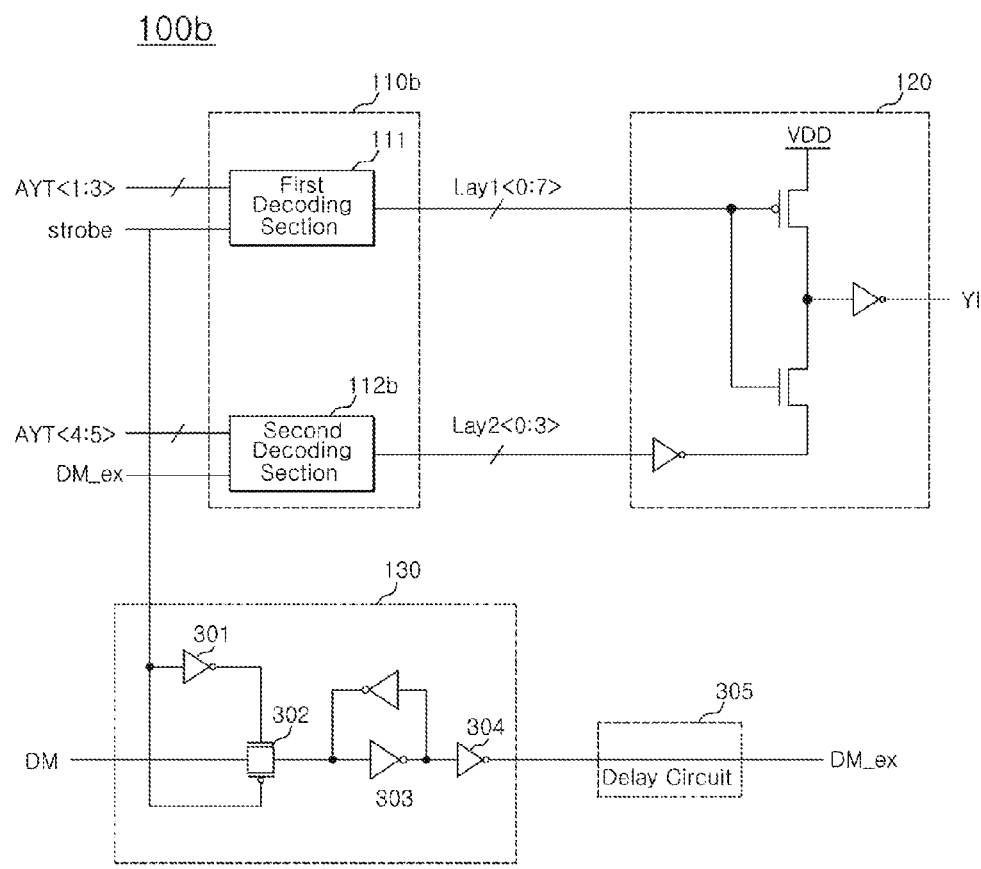
FIG. 3 is a circuit diagram illustrating another example of the column control signal generator illustrated in FIG. 1.

FIG. 3 is a circuit diagram illustrating another example of the column control signal generator 100 illustrated in FIG. 1.

The column control signal generator 100*b* illustrated in FIG. 3 may include a blocking signal generation unit 130 configured to generate a blocking signal DM_ex when the data mask signal DM is activated, in addition to the configuration of the column control signal generator 100*a* illustrated in FIG. 2, and the second decoding section 112*b* receives the blocking signal DM_ex instead of the data mask signal DM. As such, when the column control signal generator 100*b* additionally includes the blocking signal generation unit 130, the main decoding unit 120 may stably deactivate the column control signal YI, even though the synchronization time of the strobe signal STROBE does not coincide with that of the data mask signal DM. Since the data mask signal DM and the strobe signal STROBE are timing signals, the synchronization times thereof may differ depending on a process/voltage/temperature variation. This will be described in more detail with reference to FIGS. 4A and 4B.

Figure 4A:
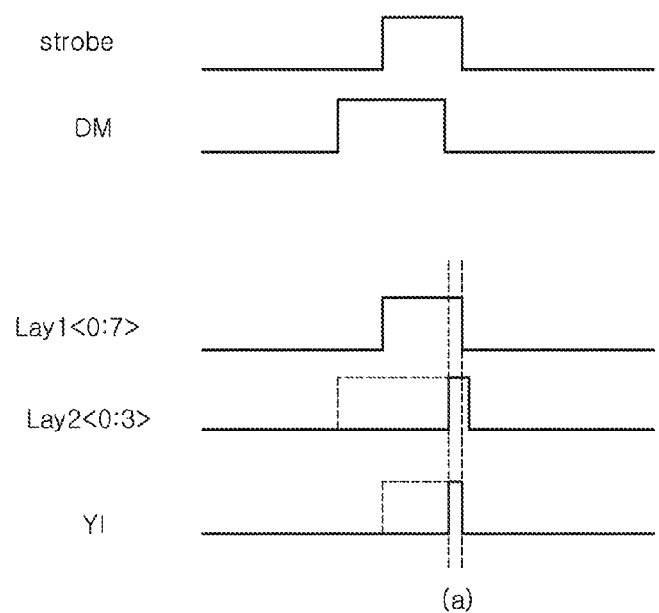
FIG. 4A is an input/output waveform diagram of the column control signal generators illustrated in FIG. 2.
Figure 4B:
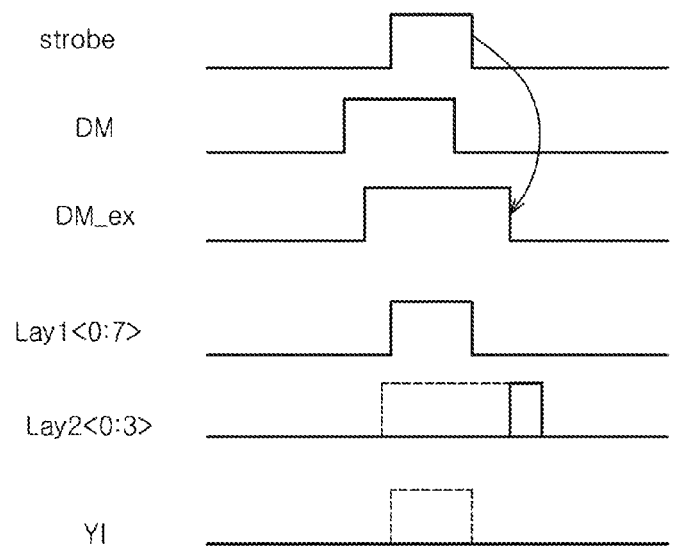
FIG. 4B is an input/output waveform diagram of the column control signal generators illustrated in FIG. 3.

FIGS. 4A and 4B are input/output waveform diagrams of the column control signal generators 100*a* and 100*b* illustrated in FIGS. 2 and 3, respectively.

FIG. 4A is a waveform showing a case in which the synchronization times of the strobe signal STROBE and the data mask signal DM inputted to the column control signal generator 100*a* of FIG. 2 do not coincide with each other. Referring to FIG. 4A, it can be seen that a falling edge of the data mask signal DM can occur before a falling edge of the strobe signal STROBE. The column control signal generator 100*a* of FIG. 2 may be configured to deactivate the column control signal YI when the data mask signal DM is activated. However, when the synchronization times of the strobe signal STROBE and the data mask signal MD do not coincide with each other as shown in FIG. 4A, the column control signal YI may be temporarily generated depending on how much the synchronization times do not coincide with each other. Referring to FIG. 4A, there exists a period (a) in which both of the second decoding signal Lay2<0:3> generated after the falling edge of the data mask signal DM and the first decoding signal Lay1<0:7> generated during the activation period of the strobe signal STROBE are activated, and thus an undesired column control signal YI is temporarily generated in correspondence to the period (a).

FIG. 4B is a waveform diagram showing a case in which the synchronization times of the strobe signal STROBE and the data mask signal DM inputted to the column control signal generator 100*b* of FIG. 3 do not coincide with each other. Referring to FIG. 4B, it can be seen that a falling edge of the data mask signal DM occurs before a falling edge of the strobe signal STROBE. Furthermore, a falling edge of the blocking signal DM_ex outputted from the blocking signal generation unit 130 included in the column control signal generator 100*b* of FIG. 3 may occur after a falling edge of the strobe signal STROBE. The second decoding unit 120 included in the column control signal generator 100*b* of FIG. 3 may generate the second decoding signal Lay2<0:3> in response to the blocking signal DM_ex. Therefore, in FIG. 4B, there does not exist while both of the second decoding signal Lay2<0:3> and the first decoding signal Lay1<0:7> are activated. Accordingly, an undesired column control signal YI may not be activated. Here, the block signal generation unit 130 may be configured in such a manner that the falling edge of the blocking signal DM_ex occurs after the falling edge of the strobe signal STROBE. In this case, regardless of whether the time point at which the falling edge of the data mask signal DM occurs is earlier or later than the time point at which the falling edge of the strobe signal STROBE occurs, the pulse width of the blocking signal DM_ex becomes wider than the pulse width of the strobe signal STROBE.

The blocking signal generation unit 130 of FIG. 3 may be configured to generate the blocking signal DM_ex such that the falling edge of the blocking signal DM_ex occurs after the falling edge of the strobe signal STROBE. The blocking signal generation unit 130 generates the blocking signal DM_ex in response to the data mask signal DM and the strobe signal STROBE. The blocking signal generation unit 130 may include inverters 301 and 304, a pass gate 302, and a latch circuit 303. The inverter 301 may be configured to invert and output the strobe signal STROBE. The pass gate 302 may be configured to pass the data mask signal DM in response to an output signal of the inverter 301 and the strobe signal STROBE. The latch circuit 303 may be configured to latch an output signal of the pass gate 302. The inverter 304 may be configured to invert a logic value of the latch circuit 303 and output the inverted logic value as the blocking signal DM_ex. The falling edge of the blocking signal DM_ex generated by the blocking signal generation unit 130 configured in such a manner occurs after the falling edge of the strobe signal STROBE.

The blocking signal generation unit 130 illustrated in FIG. 3 may additionally include a delay circuit 305 coupled to an output terminal of the inverter 304. As such, when the block signal generation unit 130 additionally includes the delay circuit 305, the waveform of the second decoding signal Lay2<0:3> of FIG. 4B may be further improved. As indicated by the second decoding signal Lay2<0:3> of FIG. 4B, the second decoding signal Lay2<0:3> may be activated while it deviates from the pulse width of the blocking signal DM_ex. The activation period of the second decoding signal Lay2<0:3> activated while it deviates from the pulse width of the blocking signal DM_ex is different from the activation period of the first decoding signal Lay1<0:7>. Therefore, an unexpected column control signal YI is not activated. However, although an unexpected column control signal YI is not activated, the activation of the second decoding signal Lay2<0:3> is useless. In order to prevent unnecessary current consumption and unexpected malfunctions, the column control signal generator 100 may be set so as not to generate the second decoding signal Lay2<0:3>.

The pre-decoding unit 110b illustrated in FIG. 3 may include a first decoding section 111 and a second decoding section 112b, like the pre-decoding unit 110a illustrated in FIG. 2. The pre-decoding unit 110b illustrated in FIG. 3 may be configured in the same manner as the pre-decoding unit 110a illustrated in FIG. 2, except that the second decoding section 112b receives the blocking signal DM_ex instead of the data mask signal DM.

The main decoding unit 120 illustrated in FIG. 3 may be configured in the same manner as the main decoding unit 120 illustrated in FIG. 2.

Figure 5:
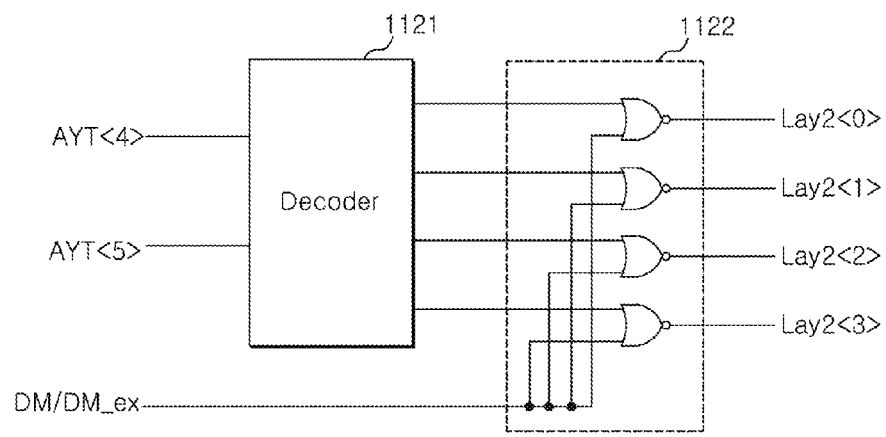
FIG. 5 is a circuit diagram illustrating an example of second decoding sections illustrated in FIGS. 2 and 3.

FIG. 5 is a circuit diagram illustrating an example of the second decoding sections 112a and 122b illustrated in FIGS. 2 and 3.

The second decoding section may include a decoder 1121 and a combination section 1122, as illustrated in FIG. 5.

The decoder 1121 may be configured to receive and decode the second address signal AYT<4:5>. The decoder 1121 may include a general decoder. The decoder 1121 illustrated in FIG. 5 may decode the 2-bit second address signal AYT<4:5> and generate a 4-bit decoding signal.

The combination section 1122 may be configured to perform a NOR operation on an output signal of the decoder 1121 and the data mask signal DM of FIG. 2 and output the second decoding signal Lay2<0:3>. The combination section 1122 may include a plurality of NOR gates.

When the data mask signal DM is deactivated to a low level, the second decoding section 112a configured as illustrated in FIG. 5 may decode the second address signal AYT<4:5> and output the decoded signal as the second decoding signal Lay2<0:3>. On the other hand, when the data mask signal DM is activated to a high level, the second decoding section 112a may deactivate the second decoding signal Lay2<0:3> to a low level and output the second decoding signal Lay2<0:3>, regardless of the second address signal AYT<4:5>.

The second decoding section 112b of FIG. 3 may be configured in such a manner as illustrated in FIG. 5. The second decoding section 112b of FIG. 3 may be configured in the same manner as the second decoding section 112a of FIG. 5, except that the combination section 1122 receives the blocking signal DM_ex instead of the data mask signal DM.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a column control signal generator configured to control a column control signal for a pair of bit lines corresponding to a data mask during a data mask operation, wherein the column control signal generator deactivates the column control signal for a pair of bit lines corresponding to the data mask during the data mask operation; and
a bit line sense amplifier configured to sense and amplify a voltage difference between the pair of bit lines and couple the pair of bit lines to a pair of segment input/output lines in response to the column control signal.

2. The semiconductor memory apparatus according to claim 1, wherein the column control signal generator comprises:
a pre-decoding unit configured to receive a column address signal, a strobe signal, and a data mask signal and to generate a decoding signal; and
a main decoding unit configured to generate the column control signal in response to the decoding signal,
wherein the pre-decoding unit generates the decoding signal such that the main decoding unit deactivates and generates the column control signal when the data mask signal is activated.

3. The semiconductor memory apparatus according to claim 2, wherein the column address signal comprises first and second address signals,
the decoding signal comprises first and second decoding signals, and
the pre-decoding unit comprises:
a first decoding section configured to generate the first decoding signal by decoding the first address signal when the strobe signal is activated; and
a second decoding section configured to generate the second decoding signal by decoding the second address signal when the data mask signal is deactivated, and to generate the second decoding signal such that the main decoding unit deactivates and generates the column control signal when the data mask signal is activated.

4. The semiconductor memory apparatus according to claim 3, wherein the main decoding unit activates and outputs the column control signal when both of the first and second decoding signals are activated.

5. A semiconductor memory apparatus comprising:
a blocking signal generator configured to activate a blocking signal when a data mask signal is activated; and
a column control signal generator configured to generate a column control signal by decoding a column address signal while a strobe signal is activated, wherein the column control signal generator deactivates the column control signal when the blocking signal is activated.

6. The semiconductor memory apparatus according to claim 5, wherein the blocking signal generator additionally receives the strobe signal, and deactivates the blocking signal after the strobe signal is deactivated.

7. The semiconductor memory apparatus according to claim 6, wherein the blocking signal generator comprises:
   a passing unit configured to pass the data mask signal in response to the strobe signal; and
   a latch unit configured to latch the passed data mask signal.

8. The semiconductor memory apparatus according to claim 7, wherein the blocking signal generator further comprises a delay unit configured to delay the latching result.

9. The semiconductor memory apparatus according to claim 6, wherein the column control signal generator comprises:
   a pre-decoding unit configured to receive the column address signal, the strobe signal, and the blocking signal and generate a decoding signal; and
   a main decoding unit configured to generate the column control signal in response to the decoding signal,
   wherein the pre-decoding unit generates the decoding signal such that the main decoding unit deactivates and generates the column control signal when the data mask signal is activated.

10. The semiconductor memory apparatus according to claim 9, wherein the column address signal comprises first and second address signals; the decoding signal comprises first and second decoding signals;
   and the pre-decoding unit comprises:
   a first decoding section configured to generate the first decoding signal by decoding the first address signal and, when the strobe signal is activated; and
   a second decoding section configured to generate the second decoding signal by decoding the second address signal, when the blocking signal is deactivated, and generate the second decoding signal such that the main decoding unit deactivates and generates the column control signal, when the blocking signal is activated.

11. The semiconductor memory apparatus according to claim 10, wherein the main decoding unit activates and outputs the column control signal, when both of the first and second decoding signals are activated.

12. The semiconductor memory apparatus according to claim 5, further comprising a bit line sense amplifier configured to sense and amplify a voltage difference between a pair of bit lines, and to electrically couple the pair of bit lines to a pair of segment input/output lines in response to the column control signal.

* * * * *